(12) United States Patent
Risbo et al.

(10) Patent No.: US 8,189,817 B2
(45) Date of Patent: May 29, 2012

(54) SYSTEM FOR AMPLIFIERS WITH LOW DISTORTION AND LOW OUTPUT IMPEDANCE

(75) Inventors: Lars Risbo, Hvalsoe (DK); Soeren Poulsen, Lyngby (DK)

(73) Assignee: Texas Instruments Incorporated, Dallas, TX (US)

( * ) Notice: Subject to any disclaimer, the term of this patent is extended or adjusted under 35 U.S.C. 154(b) by 933 days.

(21) Appl. No.: 12/206,510

(22) Filed: Sep. 8, 2008

(65) Prior Publication Data

US 2009/0028361 A1   Jan. 29, 2009

Related U.S. Application Data

(63) Continuation of application No. 11/501,349, filed on Aug. 9, 2006, now abandoned.

(60) Provisional application No. 60/713,039, filed on Aug. 31, 2005.

(51) Int. Cl.
   *H03F 21/00* (2006.01)

(52) U.S. Cl. ........... 381/121; 330/10; 330/251; 381/120

(58) Field of Classification Search .................... 381/56, 381/57, 28, 104, 116, 117, 111, 120, 121, 381/59; 700/94; 330/120 R, 124 R, 10, 250, 330/251, 207 A, 207 R, 294; 375/328
See application file for complete search history.

(56) References Cited

U.S. PATENT DOCUMENTS

| | | | | |
|---|---|---|---|---|
| 5,214,392 A * | 5/1993 | Kobayashi et al. | ............. | 330/10 |
| 5,805,020 A * | 9/1998 | Danz et al. | ....................... | 330/10 |
| 6,420,930 B1 * | 7/2002 | Takagishi | ...................... | 330/251 |
| 6,473,457 B1 * | 10/2002 | Pascual et al. | ................. | 375/238 |
| 7,002,406 B2 * | 2/2006 | Risbo et al. | ..................... | 330/10 |
| 7,183,840 B2 * | 2/2007 | Maejima | .......................... | 330/10 |
| 7,279,970 B2 * | 10/2007 | Yokoyama et al. | ............. | 330/99 |

* cited by examiner

*Primary Examiner* — Xu Mei
*Assistant Examiner* — Lun-See Lao
(74) *Attorney, Agent, or Firm* — John J. Patti; Wade J. Brady, III.; Frederick J. Telecky, Jr.

(57) ABSTRACT

System for pulse-width-modulated class D audio amplifiers. In one preferred embodiment an adder is described to generate a difference signal responsive to an input signal and a feedback signal, a pulse-width-modulator coupled to the adder to compare the difference signal to a reference signal and produce a pulse-width-modulated signal based on the comparing, a filter coupled to an output of the pulse-width-modulator, and a loop filter having a first input coupled to the output of the filter and a second input coupled to the input of the filter, the loop filter to generate a feedback signal by applying transfer functions to signals at its inputs. The loop transfer function of the amplifier is minimum aliasing error transfer function. The minimum aliasing error properties provide low distortion and taking the feedback from the output of the filter reduces high frequency output impedance.

21 Claims, 7 Drawing Sheets

SYSTEM FOR AMPLIFIERS WITH LOW DISTORTION AND LOW OUTPUT IMPEDANCE

This application is a continuation of application Ser. No. 11/501,349, filed 9 Aug. 2006, which claims the benefit of U.S. Provisional Application No. 60/713,039, filed on Aug. 31, 2005, entitled "Passive Loop Filter for Switching Amplifiers Providing Low Distortion and Low Output Impedance," which applications are hereby incorporated herein by reference.

TECHNICAL FIELD

The present invention relates generally to a system for audio signal amplification, and more particularly to a system for pulse width modulated class D audio amplifiers.

BACKGROUND

There are several different types or classes of audio amplifiers. A class A amplifier will conduct a DC current even though there is no audio signal present at the amplifier's input. The class A amplifier will also have a single polarity voltage swing. A class B amplifier is more efficient than a class A amplifier due to the fact that both of the class B amplifier's differential mode voltage swings are not on at the same time. Class AB amplifiers maintain a small bias current through complementary output drive transistors, so that the output voltage swing is centered about a ground voltage.

Class D amplifiers amplify the audio signal using digital processing techniques and drive a complementary output signal that is digital in nature, with an output voltage swing that is capable of moving fully from rail-to-rail where the output stage operates in switched mode. The output voltage waveform of a class D amplifier has a duty cycle that varies with the amplitude of the input signal.

Figure 1A:
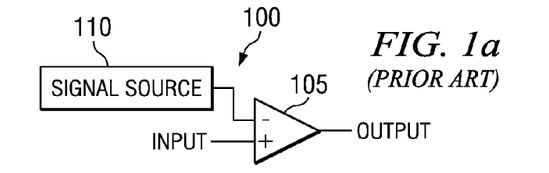
FIGS. 1a through 1c are diagrams of a prior art PWM modulator and prior art models of non-feedback and feedback controlled PWM amplifiers.
Figure 1B:
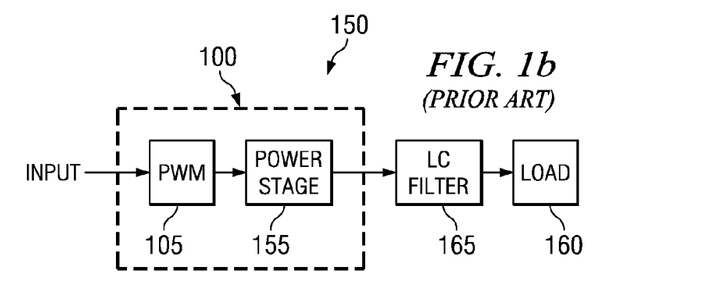
Figure 1C:
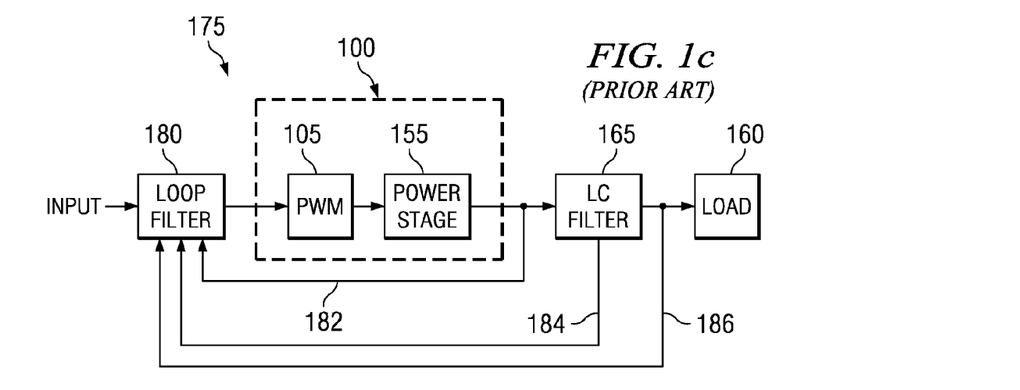

With reference now to FIGS. 1a through 1c, there are shown diagrams illustrating a prior art modulator 100 with a pulse width modulated (PWM) output signal and prior art models of a non-feedback controlled PWM amplifier 150 and a feedback controlled PWM amplifier 175. The diagram shown in FIG. 1a illustrates a modulator 100 with a PWM output signal, commonly referred to as a PWM modulator. The PWM modulator 100 includes a comparator 105 that compares an input signal against a signal that is provided by a signal source 110 (the signal provided by the signal source 110 is commonly referred to as a carrier signal) and produces an output waveform that is a two-level PWM signal. The signal source 110 is typically configured to produce a carrier signal that is a triangular waveform. For example, the comparator 105 will produce an output signal with a +1 value (for example) if the input signal is greater than the carrier signal at the time of the comparison. If the input signal is less than the carrier signal when the comparison is made, then the comparator 105 will produce an output signal with a −1 value (for example). Since both the input signal and the carrier signal can be continually varying, the output signal of the comparator 105 can change between +1 and −1. The gain of the PWM modulator 100 can be modeled as the ratio between the peak-to-peak output of the PWM modulator 100 and the peak-to-peak amplitude of the output of the signal source 110 (the carrier signal).

Alternatively, the PWM modulator 100 can operate in a self-oscillating mode without the signal source 110 and the attendant carrier signal. This can occur by applying a positive feedback signal around the comparator 105 (i.e., adding hysteresis) and/or by establishing a suitable feedback path around the comparator 105 with a combination delay and phase delay that can cause the PWM modulator 100 to oscillate and produce a two-level square wave signal out from the comparator 105.

The diagram shown FIG. 1b illustrates a prior art non-feedback controlled PWM amplifier 150. The non-feedback controlled PWM amplifier 150 includes the PWM modulator 100 along with a switching power stage 155, which typically comprises high power switches (such as MOSFETs) connected to a power supply (not shown). The switching power stage 155 produces a high power PWM signal that can drive a load 160 (a speaker, for example). With the use of the high power switches, a class D amplifier can achieve very high power efficiency, which is a significant advantage of class D amplifiers over traditional class A and class AB amplifiers.

Additionally, an inductor-capacitor (LC) filter 165 can be inserted between the switching power stage 155 and the load 160. The LC filter 165 can be used to filter out the high frequency components of the PWM signal that may otherwise cause undesired effects (such as, heating the speaker voice coil and radiating electromagnetic interference (EMI)). An ideal LC filter 165 will not dissipate energy but will only block the passage of high frequency signals. A disadvantage of the LC filter 165 is that it has a frequency response that is a function of the load impedance, i.e., the LC filter 165 has a high output impedance that tends towards infinity at the resonant frequency of the LC filter 165.

In practice, the non-feedback PWM amplifier 150 can be susceptible to non-ideal electrical behavior, such as non-harmonic components, noise and distortion arising from switching delays, non-linearities, distortions in the carrier signal, amplitude distortion, power supply noise and ripple, and so forth. The non-ideal electrical behavior can cause the PWM modulator 100 to introduce noise and distortion into the output signal. A feedback control loop added to the non-feedback PWM amplifier 150 can provide compensation for many of the problems introduced by the non-ideal electrical behavior and produce an amplifier with better performance characteristics.

The diagram shown in FIG. 1c illustrates a prior art feedback controlled PWM amplifier 175. The feedback controlled PWM amplifier 175 includes the components of the non-feedback controlled PWM amplifier 150, including the PWM modulator 100 with power switching stage 155 and the LC filter 165 and can be coupled to the load 160. The feedback controlled PWM amplifier 175 also includes a loop filter 180 and multiple feedback loops, including a first feedback loop 182 from the output of the power switching stage 155, a second feedback loop 184 from the LC filter 165, and a third feedback loop 186 from the output of the LC filter 165. The feedback loops bring the signals to the loop filter 180, where the loop filter 180 implements a summing function that subtracts the feedback signals from the input signal and applies various filter transfer functions to shape the feedback controlled PWM amplifier's frequency response to control feedback suppression and system (the overall feedback controlled PWM amplifier 175) stability.

The loop filter 180 may use feedback signals from both the output of the LC filter 165 (the third feedback loop 186) and the input of the LC filter 165 (the first feedback loop 182) as well as the feedback signals derived from the LC filter 165 itself (the second feedback loop 184). The feedback signals derived from the LC filter 165 can typically be inductor or capacitor currents. Generally, the more feedback taken from the output of the LC filter 165 (the third feedback loop 186), the lower the closed loop output impedance of the feedback controlled PWM amplifier 175. However, the LC filter 165 can add a large phase delay of up to 180 degrees which can make it difficult to achieve a stable loop when the feedback is primarily taken from after the LC 165.

The feedback controlled PWM amplifier 175 can be characterized by its loop transfer function, H(s). The loop transfer function, H(s), can be obtained by conceptually opening the loop (at the output of the PWM modulator 100, for example) and calculating the transfer function of a path along the loop, around to the output of the PWM modulator 100. Therefore, in reference to FIG. 1c, the loop transfer function is a function of the loop filter 180, the PWM modulator 105, and the power switching stage 155. If loop transfer functions of feedback paths 184 and 186 were computed, the loop transfer functions would include the LC filter 165 and the load 160, respectively.

The loop transfer function provides a measure of the stability of the system (the feedback controlled PWM amplifier 175) and its ability to suppress errors, including those in the PWM modulator 105 and the power switching stage 100. The loop transfer function and its derivation is considered to be well understood by those of ordinary skill in the art of the present invention and will not be further discussed herein.

One disadvantage of the prior art is that the feedback loop takes its signal primarily before the LC filter 165, so the output impedance of the feedback controlled PWM amplifier 175 at high frequencies can be high. In a typical LC filter 165, the output impedance is highest at the frequency band around the resonant frequency of the LC filter 165. The resonant frequency of the LC filter 165 is usually placed well above the audible range; therefore, the output impedance is highest at the upper ranges of the audio frequency range. The variation in the output impedance can alter the frequency response of the LC filter 165, and therefore the frequency response of the feedback controlled PWM amplifier 175 when different loads are applied to the feedback controlled PWM amplifier 175.

Another disadvantage of the prior art is that a typical loop filter 180 will have active components, such as operational amplifiers, which could have slew-rate distortion. Therefore, a limit may need to be placed on the switching frequency of the feedback controlled PWM amplifier 175 in order to reduce slew-rate distortion, which would require the use of expensive active circuits.

Yet another disadvantage of the prior art is that aliasing error may not be minimized, resulting in higher than necessary distortion levels. The aliasing error can increase the overall distortion of the feedback controlled PWM amplifier 175.

A further disadvantage of the prior art is that feedback loops that include the LC filter 165 in the loop can be unstable when the feedback controlled PWM amplifier 175 is not loaded. A prior art technique to solve this problem is to place a so-called Zobel network on the output terminal of the feedback control PWM amplifier 175. The Zobel network provides resistive loading near the resonant frequency of the LC filter 165. The Zobel network can be a serial connection of a resistor and a capacitor with a time constant that is compatible with the time constant of the LC filter 165. However, the Zobel network will dissipate a substantial amount of power when a large amplitude audio signal is being reproduced. This reduces the overall power efficiency of the feedback controlled PWM amplifier 175 and requires bulky components as well as protection schemes to prevent damage to the components of the Zobel network due to overheating.

SUMMARY OF THE INVENTION

These and other problems are generally solved or circumvented, and technical advantages are generally achieved, by preferred embodiments of the present invention which provides a system for pulse width modulated class D audio amplifiers.

In accordance with a preferred embodiment of the present invention, an amplifier circuit is provided. The amplifier circuit includes an adder, a pulse width modulator coupled to the adder, a filter coupled to an output of the pulse width modulator, and a loop filter with a first input coupled to the output of the filter and a second input coupled to an input of the filter and an output coupled to the adder. The adder generates a difference signal responsive to an input signal and a feedback signal, the pulse width modulator compares the difference signal to a reference signal to produce a pulse width modulated signal based on the comparing, the filter having a transfer function. The loop filter generates the feedback signal by applying transfer functions to signals at its inputs, where a loop transfer function of the amplifier circuit is minimum aliasing error.

In accordance with a preferred embodiment of the present invention, an amplifier circuit is provided. The amplifier circuit includes a pulse code modulation to pulse width modulation (PCM-PWM) converter, a feedforward filter coupled to the PCM-PWM converter, an adder coupled to the feedforward filter, a pulse width modulator coupled to the adder, a filter coupled to an output of the pulse width modulator, a feedback filter with a first input coupled to an output of the feedforward filter, a second input coupled to an input of the feedforward filter, and an output coupled to the adder. The PCM-PWM converter converts an input pulse code modulated signal into a pulse width modulated signal, the feedforward filter having a transfer function, the adder generates a difference signal responsive to a signal produced by the feedforward signal and a feedback signal, the pulse width modulator compares the difference signal to a reference signal to produce a pulse width modulated signal based on the comparing, the feedforward filter having a transfer function. The feedback filter generates the feedback signal by applying transfer functions to signals at its inputs, where a loop transfer function of the amplifier circuit is minimum aliasing error.

In accordance with another preferred embodiment of the present invention, an audio system is provided. The audio system includes a coder-decoder coupled to a signal input, an amplifier coupled to the coder-decoder, and a transducer coupled to the amplifier. The coder-decoder converts an audio input signal provided at the signal input into a digital representation, the amplifier provides low output impedance and low distortion amplification of the digitized audio input signal, and the transducer converts the amplified audio input signal into audible sounds. The amplifier includes a pulse code modulation to pulse width modulation (PCM-PWM) converter, a feedforward filter coupled to the PCM-PWM converter, an adder coupled to the feedforward filter, a pulse width modulator coupled to the adder, a filter coupled to an output of the pulse width modulator, a feedback filter with a first input coupled to an output of the feedforward filter, a second input coupled to an input of the feedforward filter, and an output coupled to the adder. The PCM-PWM converter converts an input pulse code modulated signal into a pulse width modulated signal, the feedforward filter having a transfer function, the adder generates a difference signal responsive to a signal produced by the feedforward signal and a feedback signal, the pulse width modulator compares the difference signal to a reference signal to produce a pulse width modulated signal based on the comparing, the feedforward filter having a transfer function. The feedback filter generates the feedback signal by applying transfer functions to signals at its inputs, where a loop transfer function of the amplifier circuit is minimum aliasing error.

An advantage of a preferred embodiment of the present invention is that the loop filter of the feedback controlled PWM amplifier is passive in nature, so that problems with active components, such as slew-rate distortion present in operational amplifiers, are avoided.

A further advantage of a preferred embodiment of the present invention is that the feedback loop takes its feedback signal from after the loop filter. This enables a reduction in the output impedance of the feedback controlled PWM amplifier in the frequency range of relevance (e.g. audio band).

Yet another advantage of a preferred embodiment of the present invention is that the minimum aliasing error (MAE) property of the loop transfer function helps to ensure that the ripple of the loop filter is triangular, which reduces the total harmonic distortion that is induced by the feedback loop.

A further advantage of a preferred embodiment of the invention is that the feedback controlled PWM amplifier is stable even without load, therefore, eliminating the need for a Zobel network.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a class D amplifier for audio signals with low distortion and low output impedance. The invention may also be applied, however, to other types of class D amplifiers with applications in other areas, such as switching power supplies, motor control applications, non-audio signal amplifiers, and so forth.

Minimum aliasing error (MAE) helps to ensure that the ripple present in the loop filter signal is as close to the ideal shape (triangular) as possible by reducing (or eliminating) aliasing errors. The closer the ripple is to the ideal shape, the lower the total harmonic distortion (THD) in the PWM modulator. One technique used to achieve MAE is to sum a second order integrated output (such as the output of the feedback controlled PWM modulator's LC filter) with a first-order real-poled low-pass filter. The scaling of the two terms are chosen so that the two terms have substantially equal magnitudes at the frequency of the first-order real pole. A detailed discussion of MAE loop filters can be found in co-assigned U.S. Pat. No. 7,002,406, entitled "Loop Filter for Class D Amplifiers," which is herein incorporated by reference.

The use of a PWM modulator with a purely passive loop filter after an LC filter in the PWM modulator has been disclosed in a paper entitled "Simple Self-Oscillating Class D Amplifier with Full Output Filter Control" by Bruno Putzeys, published May 2005, which is herein incorporated by reference. A purely passive loop filter can offer advantages, for example, slew-rate distortion that is present in operational amplifiers can be avoided. The slew-rate distortion present in operational amplifiers can be reduced through the use of further active circuits, however, their use can increase the cost and complexity of the PWM modulator.

Figure 2A:
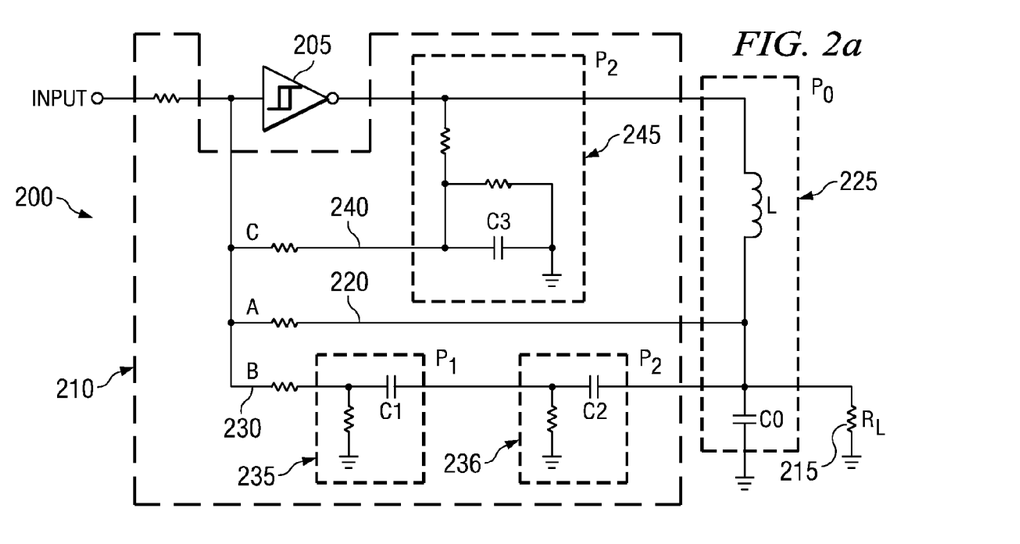
FIGS. 2a through 2c are diagrams of a feedback controlled PWM amplifier, a plot of the loop transfer functions of the feedback controlled PWM amplifier, and data plots illustrating magnitude versus frequency and phase angle versus frequency plots for the loop transfer function H(s) of the feedback controlled PWM amplifier, according to a preferred embodiment of the present invention.

With reference now to FIG. 2a, there is shown a diagram illustrating an exemplary feedback controlled PWM amplifier 200 with a MAE loop transfer function and a purely passive loop filter, according to a preferred embodiment of the present invention. The feedback controlled PWM amplifier 200 includes a PWM modulator 205 (that may include a comparator, carrier signal source, and a power switching stage), a passive loop filter 210 and an LC filter 225. Also shown in FIG. 2a is a load resistor 215, which can be representative of an audio speaker, for example. The loop filter 210 provides three feedback loops (or feedback paths), a first loop 220, a second loop 230, and a third loop 240. The first loop 220 (also labeled in FIG. 2a as loop A) can provide a direct feedback loop (path) from after the LC filter 225. The first loop 220 has a complex pole located at $P_0$. The second loop (path) 230 (labeled as loop B in FIG. 2a) provides a high-pass filtered version of the feedback signal provided by the first loop 220, wherein the high-pass filter can have a second order behavior, as provided by a first first-order high-pass filter 235 with a pole at $P_1$ and a second first-order high-pass filter 236 with a pole at $P_2$.

The feedback signal as provided by the second loop (path) 230 can have the appearance of a simple first-order passive filtered version of the LC filter 225 input at frequencies above pole $P_0$. Combining this with the feedback signal produced by the first loop 220 with a proper weighing produces a MAE loop output. The feedback signal produced by the second loop 230 contains an additional pole at $P_2$ that can cause excessive phase delay and increase the total harmonic distortion (THD) due to aliasing errors. To provide compensation, the third loop (path) 240 (labeled as loop C) provides a first-order low-pass (low-pass filter 245) filtered version of the LC filter 225 input with a pole at $P_2$. Properly weighted, the feedback signal provided by the third loop 240 can re-establish the MAE property. There may be an undesired increase in load response variation (output impedance), however, if $P_2$ is placed at a high frequency, the increase in the load response variation can be very small in the audible frequencies. Clearly, the loop filter 210 is purely passive and takes its input mainly from after the LC filter 225 while maintaining MAE properties.

Figure 2B:
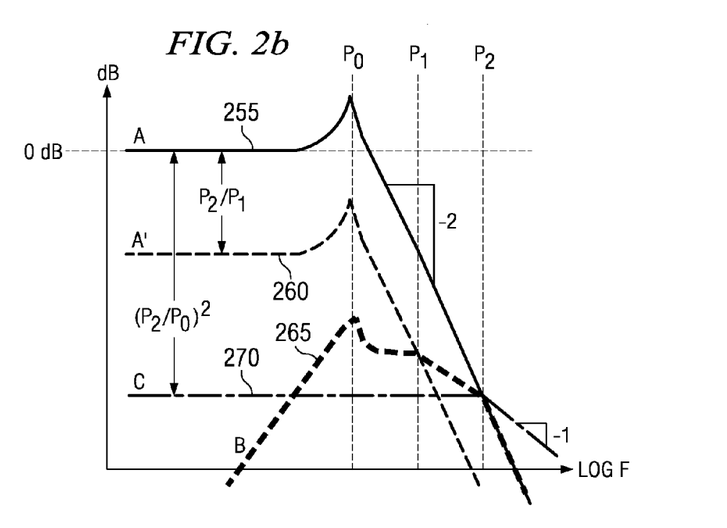

With reference now to FIG. 2b, there is shown a plot illustrating the transfer functions of the various loops (paths) of the feedback controlled PWM amplifier 200 shown in FIG. 2a, according to a preferred embodiment of the present invention. A first curve 255 (labeled A) corresponds to the transfer function of the first loop 220 and illustrates a low-pass filter response with a pole at $P_0$ and a second curve 260 (labeled A') can be a scaled version of the first curve 255, wherein the scaling is with a factor of $P_2/P_1$. A third curve 265 (labeled B) corresponds to the transfer function of the second loop 230 and illustrates a high-pass filter response with poles at $P_1$ and $P_2$ and a fourth curve 270 (labeled C) corresponds to the transfer function of the third loop 240 and illustrates a low-pass filter response with pole at $P_2$.

The second curve 260 (A') shows how the first curve 255 (A) can be scaled so that it can be combined with the third curve 265 (B) and the fourth curve 270 (C) to produce a MAE loop output. Since the second loop 260 is scaled by factor $P_2/P_1$, it can also limit the location of $P_2$ since the gain of the loop can be affected by the scaling factor. With proper scaling, the fourth curve 270 (C) can be added to continue the first-order behavior beyond pole $P_2$.

Figure 2C:
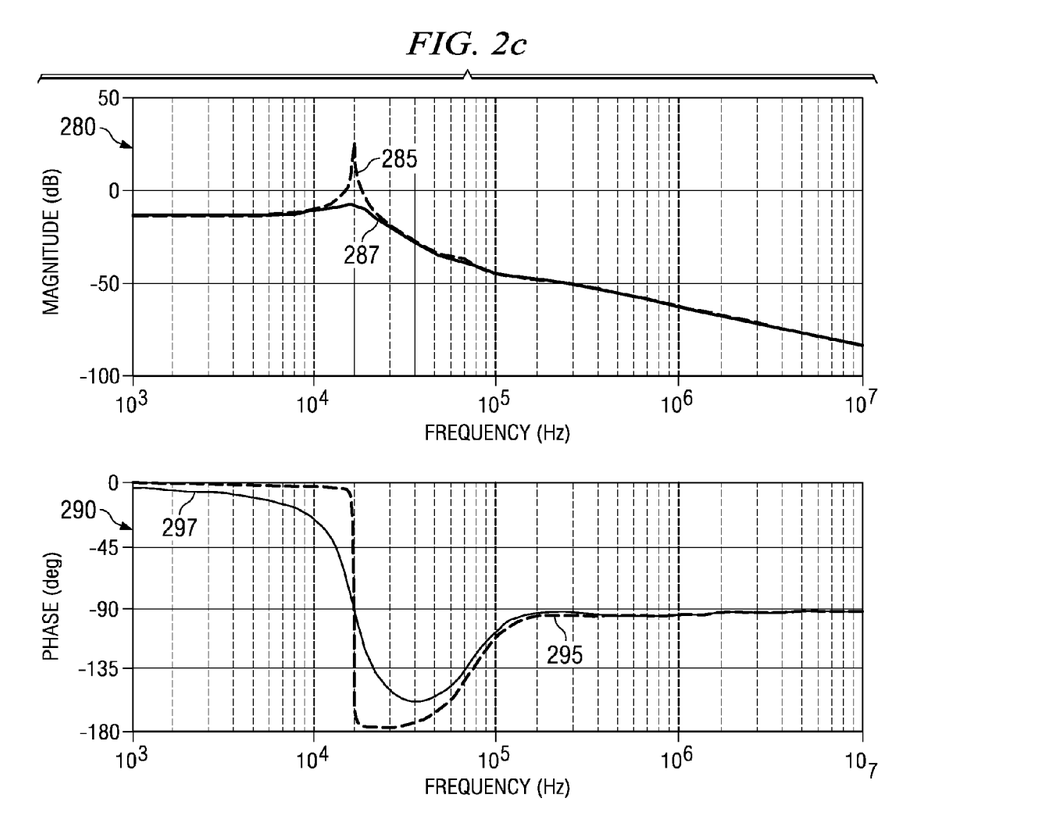

With reference now to FIG. 2c, there are shown data plots illustrating magnitude versus frequency and phase angle versus frequency plots for the loop transfer function H(s) of the feedback controlled PWM amplifier 200 (with the gain of the PWM modulator 205 excluded) with typical component values, according to a preferred embodiment of the present invention. The data plots shown in FIG. 2c are for the loop filter 210 with poles located at 20 kHz ($P_0$), 100 kHz ($P_1$), and 500 kHz ($P_2$), and with an inductor value of 10 uH, two possible values for the load resistor 215 (4 ohms and 200 ohms), and a switching frequency of 200 kHz.

A first data plot 280 illustrates magnitude (in dB) versus frequency, with a first curve 285 (corresponding to the load resistor 215 being equal to 4 ohms) and a second curve 287 (corresponding to the load resistor 215 being equal to 200 ohms). Both curves show a peaking about 20 kHz ($P_0$) and a good first-order roll-off. A second data plot 290 illustrates phase angle versus frequency, with a third curve 295 (corresponding to the load resistor 215 being equal to 4 ohms) and a fourth curve 297 (corresponding to the load resistor 215 being equal to 200 ohms). Both curves show a phase response that is substantially equal to 90 degrees at frequencies above 200 kHz, clearly displaying the MAE property.

Furthermore, the well-controlled phase behavior substantially equal to 90 degrees above 200 kHz ensures that the entire loop is stable according to the Bode stability criterion if the unity gain frequency is above approximately 100 kHz. The Bode stability criterion is considered to be well understood by those of ordinary skill in the art of the present invention and will not be discussed herein. The unity gain frequency can be adjusted by varying the gain of the PWM modulator 205. For example, a PWM modulator 205 with a gain of 50 dB results in a unity gain point of approximately 200 kHz (the magnitude graph shown in FIG. 2c intersects −50 dB at around 200 kHz) at which the phase is 90 degrees giving a comfortable phase margin of 90 degrees. Given a PWM modulator 205 with a gain of 50 dB, the loop transfer function has approximately 35 dB gain in the audible frequency range (the magnitude graph shown in FIG. 2c within audible frequencies is approximately at −15 dB plus the 50 dB gain in the PWM modulator 205). This results in a 35 dB reduction in the noise and distortion that is introduced inside the PWM modulator 205 (and including a power switching stage (not shown)). The switching frequency should be chosen to be at least 3-4 times the unity gain frequency to ensure stability. The data plots illustrate good behavior with a wide range of load resistance values and the system is stable even without a load resistor. Consequently, the need for the undesired Zobel networks is eliminated.

The feedback controlled PWM amplifier 200 may also operate in self-oscillating mode by removing the carrier signal inside the PWM modulator 205 and adding hysteresis, for example, by applying a positive feedback path from the output of the PWM modulator 205 (and including the power switching stage (not shown)) back to its input. The oscillation frequency is then a function of the amount of hysteresis and the loop transfer function (especially the phase characteristic).

Figure 3A:
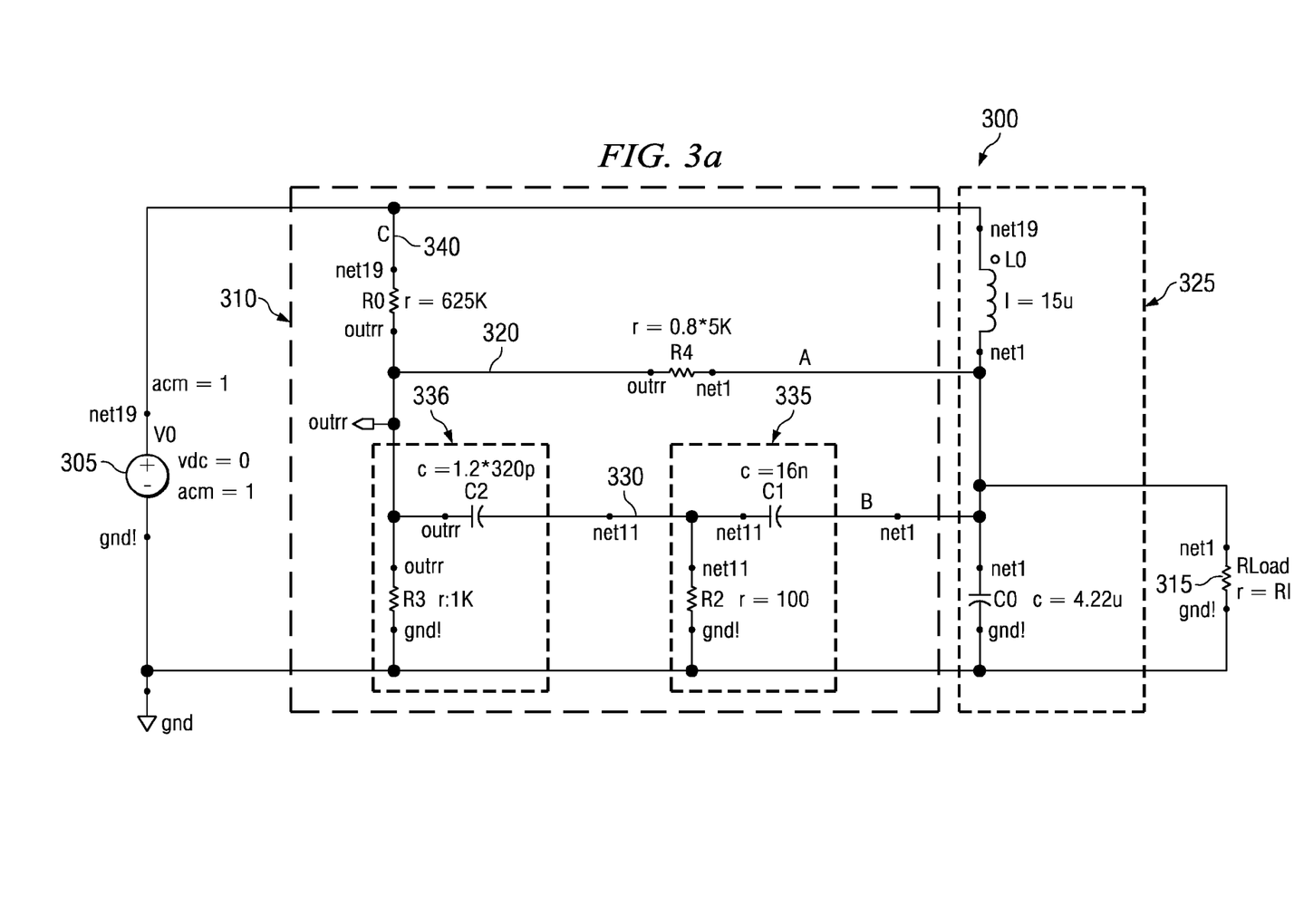
FIGS. 3a and 3b are diagrams of a simplified feedback controlled PWM amplifier and a plot of the magnitude and phase behavior of the simplified feedback controlled PWM amplifier, according to a preferred embodiment of the present invention.

With reference now to FIG. 3a, there is shown a diagram illustrating an exemplary feedback controlled PWM amplifier 300, wherein the feedback controlled PWM amplifier 300 features a passive loop filter with MAE properties, according to a preferred embodiment of the present invention. The diagram shown in FIG. 3a illustrates a simplified feedback controlled PWM amplifier 300, with a fewer number of passive components as compared to the feedback controlled PWM amplifier 200 (FIG. 2a). The feedback controlled PWM amplifier 300 includes a PWM modulator (including a power switching stage) taking its input from the circuit node labeled "outrr" 305, a loop filter 310, an LC filter 325, and a load resistor 315. As with the feedback controlled PWM amplifier 200, the loop filter 310 of the feedback controlled PWM amplifier 300 includes three feedback loops (paths): a first loop 320, a second loop 330, and a third loop 340. The first loop 320 (labeled A) provides a direct feedback loop from the output of the LC filter 325 and the second loop 330 (labeled B) provides a second-order high-pass filtered version of the LC filter output (provided by high-pass filters 335 and 336), while the third loop 340 (labeled C) provides a first-order low pass filtered version of the LC filter input.

Comparing the feedback controlled PWM amplifier 300 with the feedback controlled PWM amplifier 200, the order of the high-pass filters relative to their poles is reversed. With the feedback controlled PWM amplifier 300, the high-pass filter with a pole at $P_1$ (high-pass filter 335) is placed closer to the LC filter 325 than the high-pass filter with a pole at $P_2$ (high-pass filter 336). While with the feedback controlled PWM amplifier 200, the high-pass filter 236 (pole at $P_2$) is closer to the LC filter 225 than the high-pass filter 235 (pole at $P_1$). Furthermore, the high-pass filter 336 terminates directly into a summing node (an adder). The termination of the high-pass filter 336 at the summing node results in a summing node that is no longer purely resistive, but will feature a pole at $P_2$ (this is due to the capacitor in the high-pass filter 336). The pole at $P_2$, present in the summing node, can enable a purely resistive third loop 340 (loop C), since the pole $P_2$ provides the desired low-pass response for the third loop 340.

Figure 3B:
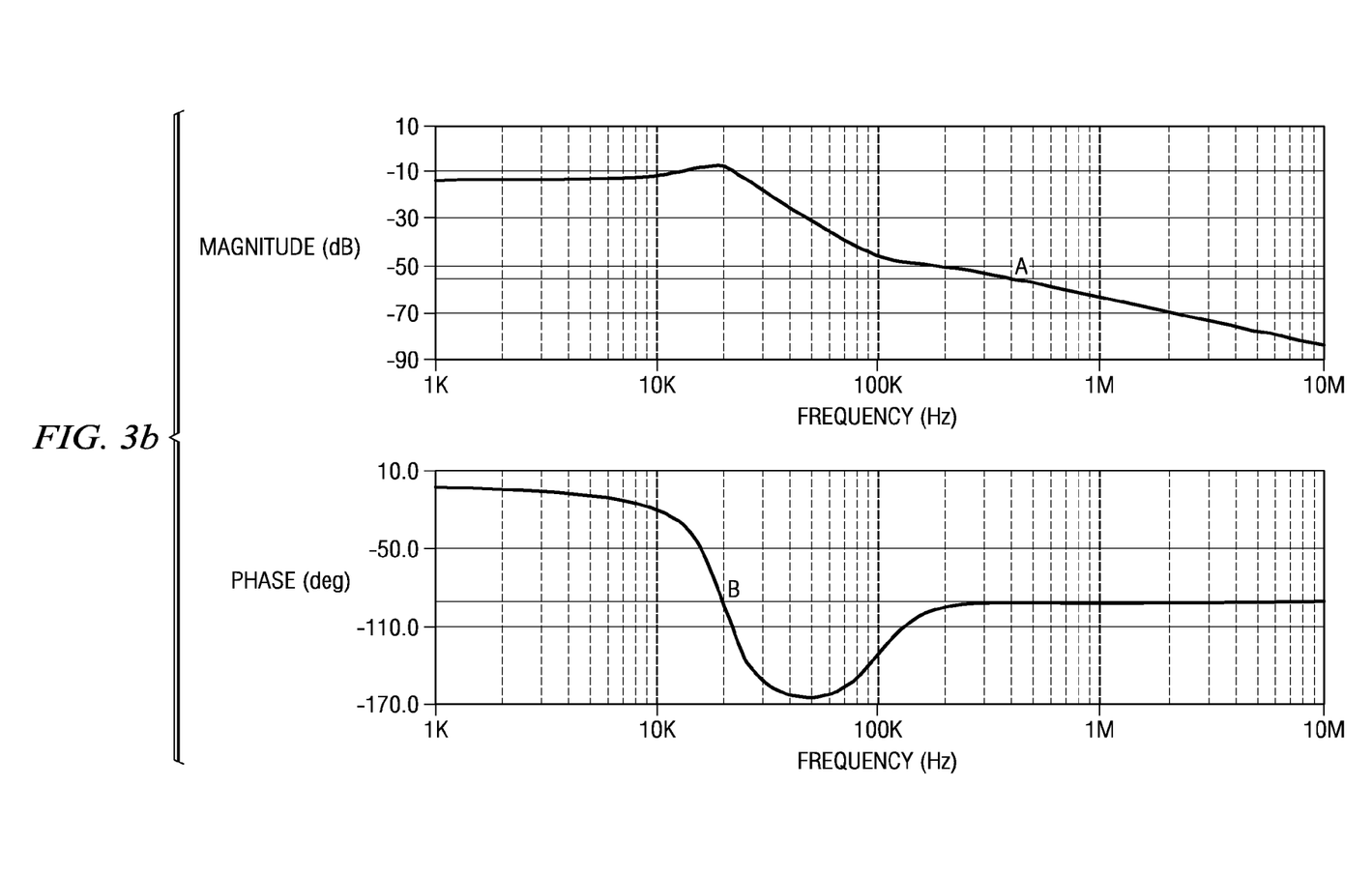

While the pole at $P_2$ also affects the first loop 320, the response is dominated by the second loop 330 and the third loop 340, so the effect can be negligible. The input signal of the feedback controlled PWM amplifier 300 can be injected into the summing node "outrr" directly as current or as a voltage source in series with R3. FIG. 3b shows data plots illustrating magnitude versus frequency and phase angle versus frequency for the loop transfer function of the feedback controlled PWM amplifier 300 with component values as shown in FIG. 3a and a four ohm load resistor 315. Again, the phase angle behavior of the feedback controlled PWM amplifier 300 above 200 kHz is substantially flat and at 90 degrees, which conforms to the MAE properties.

Figure 4:
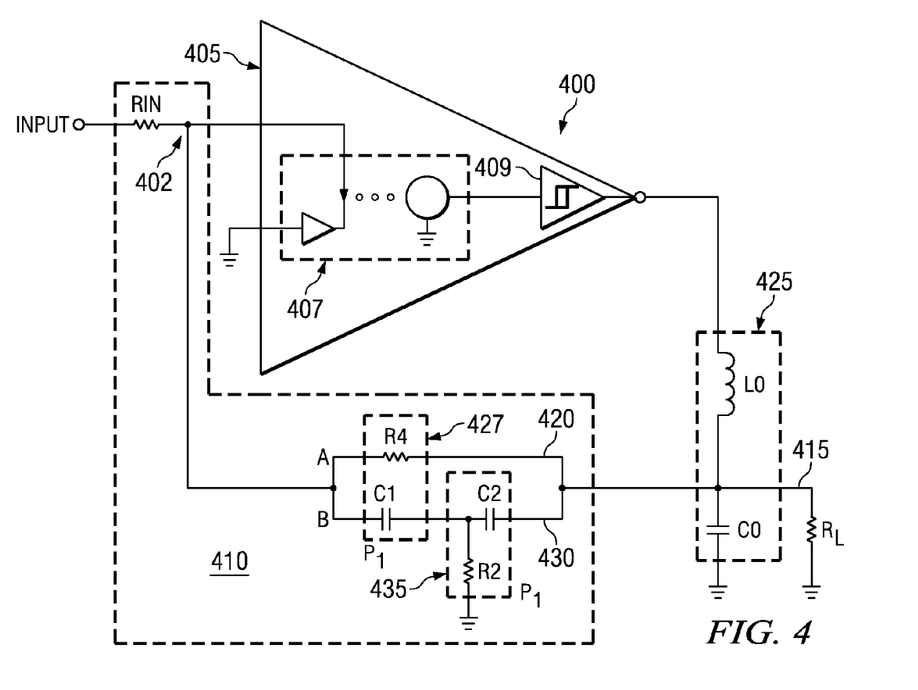
FIG. 4 is a diagram of a feedback controlled PWM amplifier with a low input impedance PWM modulator, according to a preferred embodiment of the present invention.

With reference now to FIG. 4, there is shown a diagram illustrating an exemplary feedback controlled PWM amplifier 400, wherein further simplification of a loop filter is possible through the use of active components, according to a preferred embodiment of the present invention. The feedback controlled PWM amplifier 400 includes a PWM modulator 405, a loop filter 410, and a load resistor 415. It can be possible to further simplify the feedback controlled PWM amplifier 400 by terminating the network of the loop filter 410 with a low impedance node 402 and use the input current of the low impedance node as an output signal of the loop filter 410. This can allow for a true differentiation of the output signal of an LC filter 425 due to a direct capacitive feed from the LC filter output to the low impedance input 402. The true differentiation can permit the elimination of one of the three loops of the loop filter of a typical feedback controlled PWM amplifier, such as the feedback controlled PWM amplifier 300 (FIG. 3). Although some active components are required to reduce the number of loops in the loop filter, the avoidance of operational amplifiers can prevent the occurrence of problems such as slew-rate distortion.

The PWM modulator 405 includes a current conveyor 407 and a comparator 409, which can be a simple PWM modulator, such as the PWM modulator 100 (FIG. 1a). Current conveyors provide an output current at a (output) node that is similar to another current at a different (input) node and are useful in analog integrated circuit design. Furthermore, current conveyors have low input impedance. Current conveyors are considered to be well understood by those of ordinary skill in the art of the present invention and will not be discussed herein. In an alternate preferred embodiment of the present invention, an operational amplifier arranged in an inverting configuration can be used to convert current to voltage by providing the current into an inverting input node of the operational amplifier. The loop filter 410, can now include two loops, with one loop eliminated by the differentiation of an LC filter output (LC filter 425) provided by a direct capacitive feed from the output of the LC filter 425 back to the low impedance node 402. The loop filter can include a first loop 420 (labeled A) that includes a resistor $R_4$ and a second loop 430 (labeled B) that includes a high pass filter 435 with a pole $P_1$ located at $C_2 * R_2$. The high pass filter 435 performs the differentiation and also translates voltage into current. Furthermore, the second loop 430 includes a capacitor $C_1$, which, along with the resistor $R_4$ (the combination of the capacitor $C_1$ and the resistor $R_4$ is shown in FIG. 4 as highlight 427) form a pole at $P_1$, due to a requirement that the magnitude characteristics of the first loop 420 and the second loop 430 intersect at $P_1$ frequency.

The transconductance of the first loop 420 and the second loop 430 can be expressed as:

$$G(s) = \frac{1}{R_4} + s\frac{sR_2 C_1 C_2}{1 + sR_2(C_1 + C_2)}.$$

The transconductance is a sum of the purely resistive first loop 420 (through resistor $R_4$) with a high pass filter and differentiation and a high pass filter through capacitors $C_1$ and $C_2$ of the second loop 430. To ensure that the magnitude characteristics of the first loop 420 and the second loop 430 intersect at $P_1$ as well as the second loop 430 having a pole at $P_1$ can be obtained by setting $R_4=R$, $C_1=C_2=2C$, $R_2=R/4$, where R and C form a pole at $P_1$. The closed loop low frequency gain of the feedback controlled PWM amplifier 400 is simply $Av=R_4/R_1$ since $C_1$ and $C_2$ do not conduct at low frequencies.

Figure 5A:
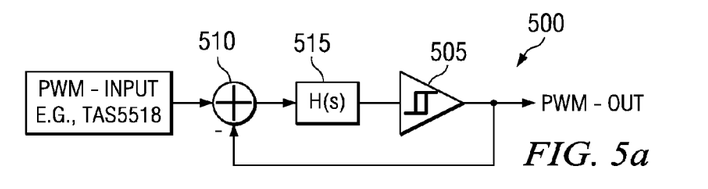
FIGS. 5a and 5b are diagrams of hybrid PWM amplifiers, according to a preferred embodiment of the present invention.
Figure 5B:
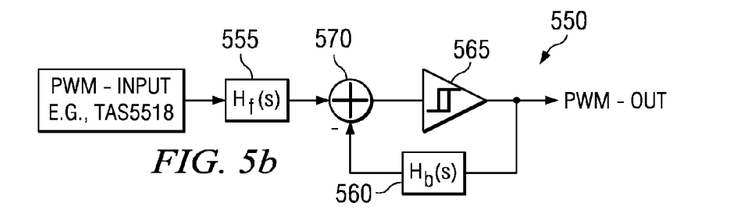

With reference now to FIGS. 5a and 5b, there are shown diagrams illustrating block diagrams illustrating PWM hybrid amplifiers, according to a preferred embodiment of the present invention. The figures shown in FIGS. 5a and 5b illustrate PWM hybrid amplifiers for use in audio applications. The PWM hybrid amplifiers can be designed to meet stringent audio specifications, such as the THX Ultra-II amplifier specifications, which use pulse code modulated (PCM) signals.

A PCM to PWM device, such as a Texas Instruments® TAS5518, can be used to convert a PCM signal into a PWM signal that can be amplified utilizing a feedback controlled PWM amplifier, such as the feedback controlled PWM amplifier 300 (FIG. 3a) and the feedback controlled PWM amplifier 400 (FIG. 4). An advantage of using a feedback controlled PWM amplifier is to enable the meeting of performance requirements, such as the output impedance is less than 0.2 ohms for input frequencies of up to 20 kHz. While this can be achieved without using feedback or digital adaptive equalization, it can be difficult to achieve in an application that integrates an entire product into an integrated circuit.

The diagram shown in FIG. 5a illustrates an exemplary embodiment of a PWM hybrid amplifier 500. The PWM hybrid amplifier 500 includes a comparator 505 with a feedback signal that can be combined with a PWM input signal at a summing node 510. The PWM input signal can be provided by a PCM to PWM device, such as the Texas Instruments® TAS5518 discussed earlier. An output of the summing node 510 can then be provided to a filter 515 with a transfer function H(s), which can then be provided to the comparator 505. The comparator 505, the summing node 510, and the filter 515 form a typical feedback controlled PWM amplifier, such as the prior art feedback controlled PWM amplifier 150 (FIG. 1b).

The hybrid PWM amplifier 500 can be rearranged into an alternate form of a hybrid PWM amplifier 550 that includes a feedforward filter 555 and a feedback filter 560. The PWM input signal (again, potentially converted from a PCM signal) can be filtered by the feedforward filter 555 and then passed through a comparator 565. The output of the comparator 565 can be feedback to a summing node 570 through the feedback filter 560. According to a preferred embodiment of the present invention, the transfer function of the feedforward filter 555 ($H_f(s)$) can be similar to the transfer function of the feedback filter 560 ($H_b(s)$). The DC gain of the hybrid PWM amplifier 550 can be expressed as:

$$A_{DC} = \frac{H_f(s=0)}{H_b(s=0)}.$$

It is possible to scale the two transfer functions to obtain any desired DC gain, with a gain that is higher than unity allowing the input PWM to be generated at a lower voltage than the output high power PWM.

A ripple signal flowing through the feedforward filter 555 needs to always be greater in magnitude than a ripple signal flowing through the feedback filter 560. This can imply that the hybrid PWM amplifier 550 can become unstable when a supply voltage of the power stage (the amplitude of the output of the comparator 565) increases beyond a certain limit. This can require that clipping occur in the power stage, since the supply voltage must be slightly lower than full scale on the input of the hybrid PWM amplifier 550.

However, the transfer function of the feedforward filter 555 ($H_f(s)$) can be designed so that it is not just a scaled version of the feedback filter 560 ($H_b(S)$). By doing so, the ripple signal flowing through the feedforward filter 555 can get stronger. This can permit safe operation with a power stage supply voltage that is adjusted for full-scale reproduction or even with a certain amount of additional headroom.

In practice, this can be achieved by moving a pole P1 of the feedforward filter's transfer function ($H_f(s)$) down in frequency to increase the magnitude at the switching frequency (thereby increasing the ripple magnitude). This allows a full scale PWM input to produce a full scale PWM output along with stable operation. Increasing the magnitude at the switching frequency does not negatively affect the hybrid PWM amplifier 550 since the feedforward filter 555 does not impact the output impedance nor the error suppression of the loop filter of the power stage.

Figure 6A:
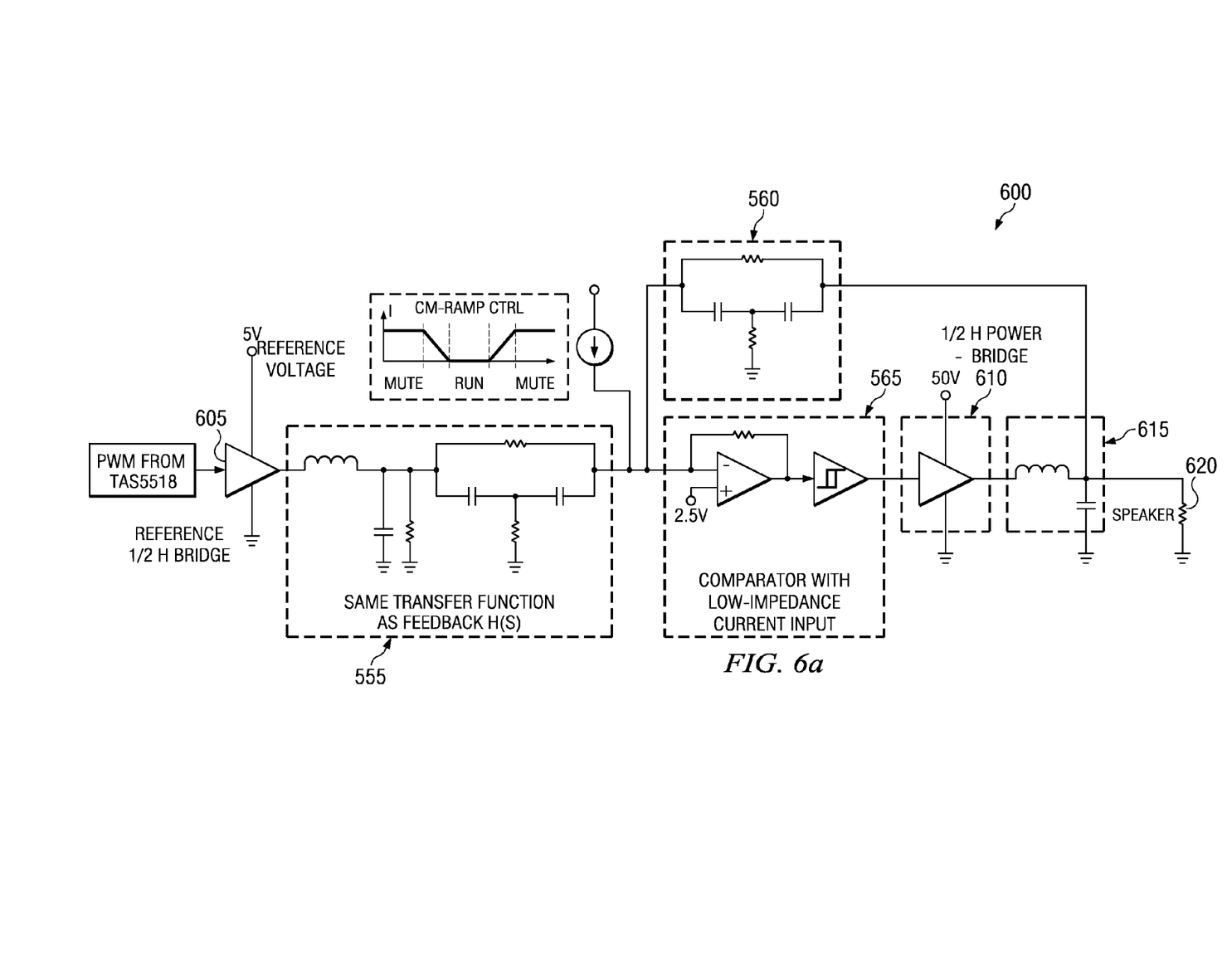
FIGS. 6a and 6b are diagrams of implementations of hybrid PWM amplifiers, according to a preferred embodiment of the present invention.
Figure 6B:
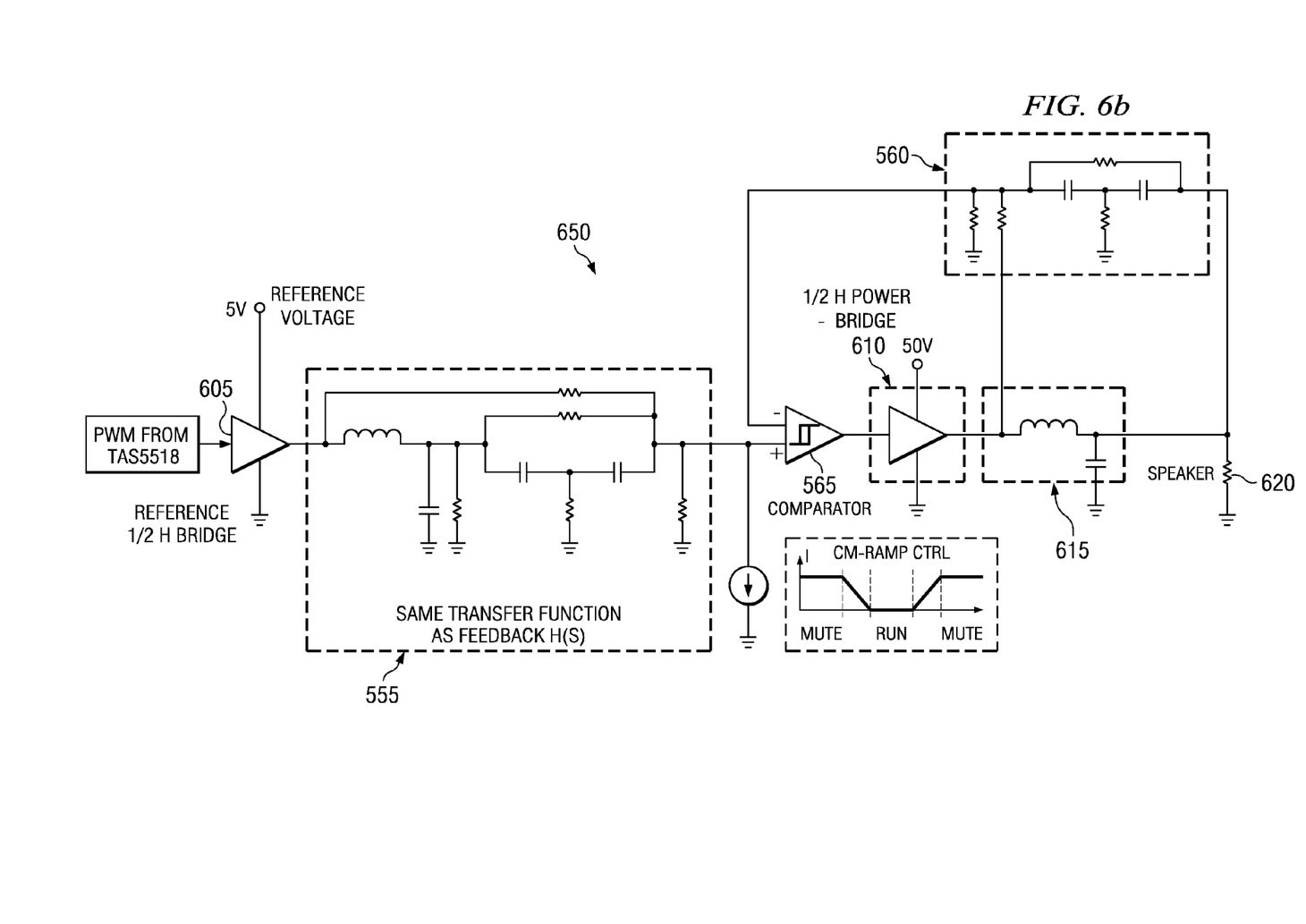

With reference now to FIGS. 6a and 6b, there are shown diagrams illustrating detailed diagrams of exemplary hybrid PWM amplifiers, according to a preferred embodiment of the present invention. The diagrams shown in FIGS. 6a and 6b illustrate practical implementations of exemplary hybrid PWM amplifiers, with a hybrid PWM amplifier 600 (FIG. 6a) utilizing a low impedance termination node to reduce the complexity of the loop filter and a hybrid PWM amplifier 650 (FIG. 6b) utilizing a purely passive network design, similar to the design shown in FIG. 3a.

The hybrid PWM amplifiers 600 and 650 include an input H-power bridge 605 between an output of a PCM to PWM device (not shown) to provide needed supply voltage. Output from the H-power bridge 605 can then be provided to the feedforward filter 555 and the comparator 565. In the case of the hybrid PWM amplifier 600, the comparator 565 can include an active device, such as a current conveyor (not shown) or an operational amplifier in an inverting configuration (shown). Output from the comparator 565 can then be provided to an output H-power bridge 610, which, in turn, can be filtered by an LC filter 615 before being used to drive a load 620, such as a speaker. In addition to driving the load 620, the output from the LC filter 615 can also be fedback to an input of the comparator 565 through the feedback filter 560.

Figure 7:
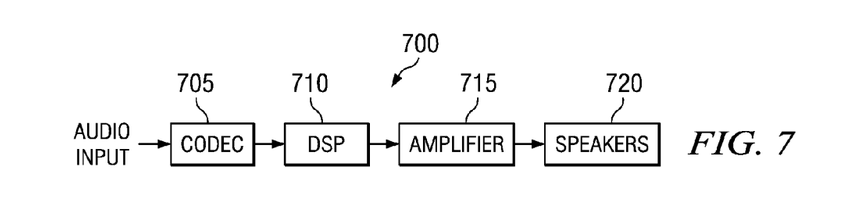
FIG. 7 is a diagram of an audio system, according to a preferred embodiment of the present invention.

With reference now to FIG. 7, there is shown a diagram illustrating an audio system 700, according to a preferred embodiment of the present invention. The audio system 700, shown in FIG. 7, may be a standalone audio system or a part of a multimedia system. The audio system 700 includes a codec (coder/decoder) 705 that has an input that receives audio signals from a CD, DVD, broadcast radio and television, computers, Internet multimedia sources, tapes, microphones, and so forth. The codec 705 can be a combination of an analog-to-digital converter (ADC) and a digital-to-analog converter (DAC).

The output of the codec 705 can be provided to a DSP 710. The DSP 710 can perform digital signal processing on the output from the codec 705, including filtering, oversampling, undersampling, decoding (such as MP3 decoding, noise reduction decoding), decompression, and so forth. If the codec 705 is operating on an analog signal, then the DSP 710 can be replaced with a preamplifier, which can amplify a low power signal into a signal with power levels suitable for processing by circuitry in the audio system 700. The output of the DSP 710 can be amplified by an amplifier 715 to desired power levels and drive speakers 720. The amplifier 715 can be a feedback controlled PWM amplifier or a hybrid PWM amplifier, according to a preferred embodiment of the present invention.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An amplifier circuit comprising:
    an adder configured to generate a difference signal responsive to an input signal and a feedback signal;
    a pulse width modulator coupled to the adder, the pulse width modulator configured to compare the difference signal to a reference signal and to produce a pulse width modulated signal based on the comparing; a filter coupled to an output of the pulse width modulator, the filter having a transfer function; and
    a loop filter having a first input coupled to an output of the filter and a second input coupled to an input of the filter, and an output coupled to the adder, the loop filter configured to generate the feedback signal by applying transfer functions to signals at its inputs, wherein a loop transfer function of the amplifier circuit is minimum aliasing error, wherein the loop filter has poles located at frequencies $P_0$, $P_1$, and $P_2$, and wherein the loop transfer function has a second order behavior between frequencies $P_0$ and $P_2$ and a first order behavior at frequencies above $P_2$.

2. An amplifier circuit comprising:
    an adder configured to generate a difference signal responsive to an input signal and a feedback signal;
    a pulse width modulator coupled to the adder, the pulse width modulator configured to compare the difference signal to a reference signal and to produce a pulse width modulated signal based on the comparing; a filter coupled to an output of the pulse width modulator, the filter having a transfer function; and a loop filter having a first input coupled to an output of the filter and a second input coupled to an input of the filter, and an output coupled to the adder, the loop filter configured to generate the feedback signal by applying transfer functions to signals at its inputs, wherein a loop transfer function of the amplifier circuit is minimum aliasing error, wherein the loop filter comprises a first feedback loop coupled to the first input, the first feedback loop comprising a first first-order high pass filter with a pole at frequency $P_1$ and a second first-order high pass filter with a pole at frequency $P_2$, wherein frequency $P_2$ is higher than frequency $P_1$, wherein the second first-order high pass filter terminates at the adder, and the loop filter further comprises a second feedback loop coupled to the second input, the second feedback loop comprising a first resistor.

3. The amplifier of claim 2, wherein the loop filter further comprises a third feedback loop coupled to the second input, the third feedback loop comprising a second resistor.

4. An amplifier circuit comprising:
an adder configured to generate a difference signal responsive to an input signal and a feedback signal;
a pulse width modulator coupled to the adder, the pulse width modulator configured to compare the difference signal to a reference signal and to produce a pulse width modulated signal based on the comparing;
a filter coupled to an output of the pulse width modulator, the filter having a transfer function; and
a loop filter having a first input coupled to an output of the filter and an output coupled to the adder, the loop filter configured to generate the feedback signal by applying a transfer function to signals at its input, wherein a loop transfer function of the amplifier circuit is minimum aliasing error,
wherein the pulse width modulator has a low impedance input,
and wherein the loop filter comprises:
a first feedback loop coupled to the first input and, comprising a first resistor; and
a second feedback loop coupled to the first input and, comprising a first-order high pass filter and a capacitor arranged serially.

5. The amplifier circuit of claim 4, wherein the first-order high pass filter is designed to form a pole at $P_1$ and the first resistor and the capacitor are designed to form a pole at $P_1$.

6. The amplifier circuit of claim 4, wherein the low impedance input of the pulse width modulator comprises a current conveyor.

7. The amplifier circuit of claim 4, wherein the low impedance input of the pulse width modulator comprises an operational amplifier arranged in an inverting configuration.

8. An amplifier circuit comprising:
a pulse code modulation to pulse width modulation (PCM-PWM) converter, the PCM-PWM converter configured to convert an input pulse code modulated signal into a pulse width modulated signal;
a feedforward filter coupled to the PCM-PWM converter, the feedforward filter having a first transfer function;
an adder coupled to the feedforward filter, the adder to generate a difference signal responsive to a signal produced by the feedforward filter and a feedback signal;
a pulse width modulator coupled to the adder, the pulse width modulator configured to compare the difference signal to a reference signal and to produce a pulse width modulated signal based on the comparing;
a filter coupled to an output of the pulse width modulator, the filter having a second transfer function; and
a feedback filter having a first input coupled to an output of the filter and an output coupled to the adder, the feedback filter configured to generate a feedback signal by applying a transfer function to signals at its input, wherein a loop transfer function of the amplifier circuit is minimum aliasing error.

9. The amplifier circuit of claim 8, wherein the feedforward filter has a pole at frequency $P_1$, wherein the feedback filter has a pole at frequency $P_1^*$, and wherein the frequency $P_1$ is slightly lower than the frequency $P_1^*$ to increase a magnitude of the transfer function of the feedforward filter at a switching frequency of the amplifier circuit.

10. The amplifier circuit of claim 8, wherein the feedback filter and the feedforward filter have substantially the same transfer function.

11. The amplifier circuit of claim 8 further comprising: an input H-power bridge coupled in between the PCM-PWM converter and the feedforward filter; and an output H-power bridge coupled in between the pulse width modulator and the filter.

12. The amplifier circuit of claim 8, wherein the feedback filter comprises a first feedback loop comprising at least one resistor and one capacitor.

13. The amplifier circuit of claim 12, wherein the feedback filter further comprises:
a second feedback loop coupled to the first input, the second feedback loop comprising a first resistor.

14. The amplifier circuit of claim 8, wherein the pulse width modulator has a low impedance input.

15. The amplifier circuit of claim 8, wherein the feedback filter comprises a second input coupled to an input of the filter.

16. The amplifier circuit of claim 15, wherein the feedback filter further comprises a second feedback loop coupled to the second input, the second feedback loop comprising a first resistor coupled between the second input and an input to the pulse width modulator.

17. An audio system comprising:
a coder-decoder coupled to a signal input, the coder-decoder configured to convert an audio input signal provided at the signal input into a digital representation;
an amplifier coupled to the coder-decoder, the amplifier to provide a low output impedance and low distortion amplification of the digital representation of the audio input signal, the amplifier comprising:
a pulse code modulation to pulse width modulation (PCM-PWM) converter, the PCM-PWM converter configured to convert the audio input signal into a pulse width modulated signal;
a feedforward filter coupled to the PCM-PWM converter, the feedforward filter having a first transfer function;
an adder coupled to the feedforward filter, the adder configured to generate a difference signal responsive to a signal produced by the feedforward filter and a feedback signal;
a pulse width modulator coupled to the adder, the pulse width modulator configured to compare the difference signal to a reference signal and to produce a pulse width modulated signal based on the comparing;
a filter coupled to an output of the pulse width modulator, the filter having a second transfer function;
a feedback filter having a first input coupled to the output of the filter and having an output coupled to the adder, the feedback filter configured to generate a feedback signal by applying a transfer function to signals at its input, wherein a loop transfer function of the amplifier circuit is minimum aliasing error (MAE);

and a transducer coupled to the amplifier, the transducer to convert the amplified audio input signal into audible sounds.

18. The audio system of claim 17, wherein the feedback filter comprises:
   a first feedback loop comprising at least one resistor and one capacitor;
   a second feedback loop coupled to the first input, the second feedback loop comprising a first resistor.

19. The audio system of claim 17, wherein the pulse width modulator has a low impedance input.

20. The audio system of claim 17 further comprising a preamplifier coupled between the coder-decoder and the amplifier, the preamplifier configured to increase the power level of the audio input signal to a signal level compatible with the audio system.

21. The audio system of claim 17, wherein the amplifier is a THX Ultra-II compliant class D amplifier.

* * * * *